United States Patent
Yamazaki et al.

(10) Patent No.: US 6,437,313 B2
(45) Date of Patent: Aug. 20, 2002

(54) METHOD FOR FORMING A SEMICONDUCTOR DEVICE HAVING A SEMICONDUCTOR FILM WITH A HEIGHT DIFFERENCE

(75) Inventors: Shunpei Yamazaki, Tokyo; Koichiro Tanaka, Kanagawa, both of (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/818,502

(22) Filed: Mar. 28, 2001

Related U.S. Application Data

(62) Division of application No. 09/210,779, filed on Dec. 15, 1998, now abandoned.

(51) Int. Cl.$^7$ ................................................. H01J 3/14
(52) U.S. Cl. ........................................ 250/216; 438/166
(58) Field of Search .............................. 250/216, 235, 250/559.22, 559.34; 438/166, 487, 308; 356/237.4, 237.5, 399–401

(56) References Cited

U.S. PATENT DOCUMENTS 5,858,822 A * 1/1999 Yamazaki et al. .......... 438/166

6,002,523 A   12/1999 Tanaka

* cited by examiner

*Primary Examiner*—Que T. Le
(74) *Attorney, Agent, or Firm*—Jeffrey L. Costellia; Nixon Peabody LLP

(57) ABSTRACT

A laser illumination apparatus for illuminating a semiconductor film with a linear laser beam while scanning the semiconductor film with the linear laser beam. An optical system generates a linear laser beam having a beam width W by dividing a pulse laser beam that is emitted from a pulsed laser light source into a plurality of beams vertically and horizontally, and combines divisional beams after they have been processed into a linear shape individually. A mechanism is provided to move a substrate that is mounted with the semiconductor film. A condition $W/20 \leq \Delta(r) \leq x \leq W/5$ or $\Delta(r) \leq W/20 \leq x \leq W/5$ is satisfied, where r is a height difference of the surface of the semiconductor film, $\Delta(r)$ is a variation amount of the beam width W as a function of the height difference r, and x is a movement distance of the substrate during an oscillation period of the pulsed laser light source.

36 Claims, 11 Drawing Sheets

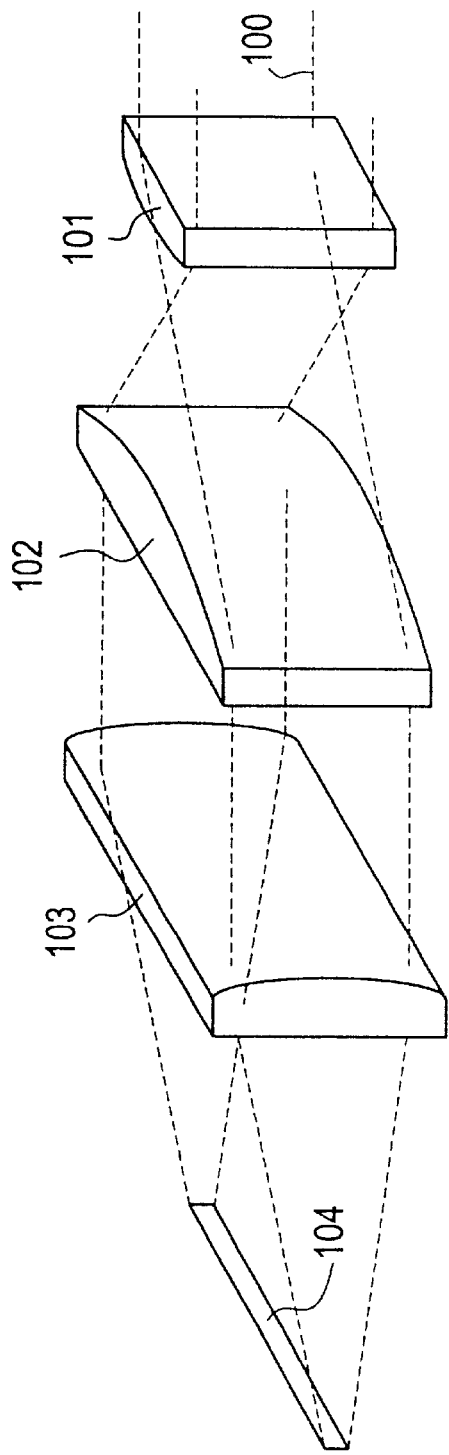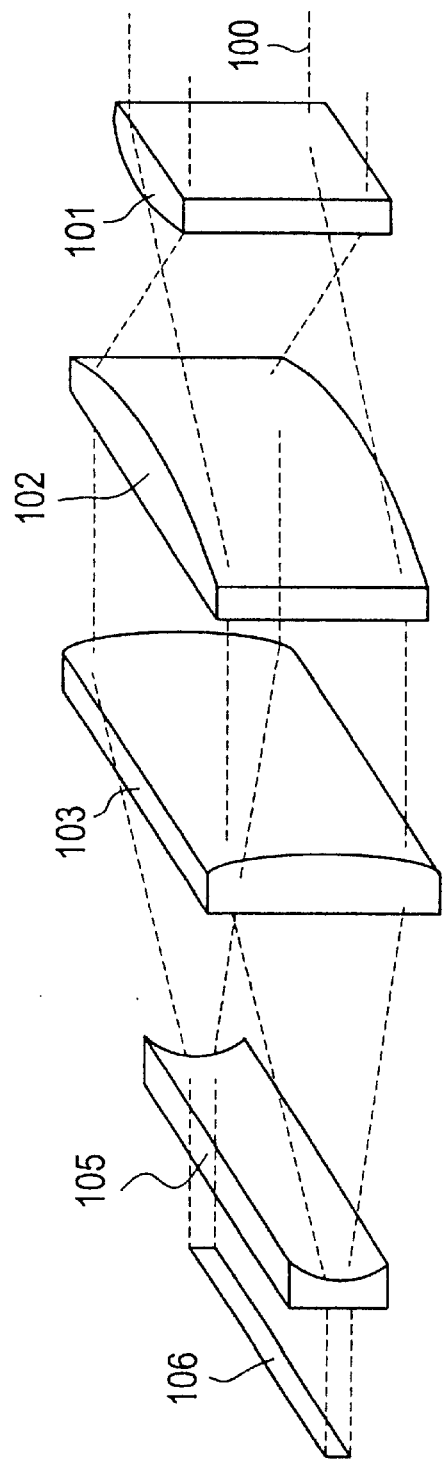

MAGNIFYING

METHOD FOR FORMING A SEMICONDUCTOR DEVICE HAVING A SEMICONDUCTOR FILM WITH A HEIGHT DIFFERENCE

This application is a divisional of prior application Ser. No. 09/210,779 field Dec. 15, 1998, now abandoned.

BACKGROUND OF THE INVENTION

1. Field of the Invention

The present invention relates to a technique capable of illuminating a large-area illumination surface with laser light that is high in uniformity. The invention is particularly suitable for annealing of a semiconductor film.

2. Description of the Related Art

In recent years, extensive studies have been made of techniques of crystallizing or improving the crystallinity of an amorphous semiconductor film or a crystalline semiconductor film (i.e., a semiconductor film that is not a single crystal but is crystalline, for example, polycrystalline or microcrystalline) by subjecting it to laser annealing. A silicon film is widely used as such a semiconductor film.

Glass substrates have an advantage that they are less expensive and higher in workability and enable formation of a large-area substrate more easily than quartz substrates that have widely been used conventionally. This is the reason for the above-mentioned studies. The reason why lasers are used for crystallization is because of low melting points of glass substrates. Lasers can crystallize a non-single-crystal film by applying high energy without changing the substrate temperature to a large extent.

Since crystalline silicon films formed by laser annealing have high mobility, they are widely used in monolithic liquid crystal electro-optical devices in which, for example, both of pixel driving TFTs (thin-film transistors) and driver circuit TFTs on a single glass substrate by using such a crystalline silicon film. Having a number of crystal grains, such a crystalline silicon film is called a polysilicon film or a polycrystalline semiconductor film.

On the other hand, because of high mass-productivity and advantages in industrial applicability, a laser annealing method is used by preference in which a laser beam emitted from an excimer laser or the like having large output power is processed by an optical system so as to form a several centimeter square spot or a line of several millimeters in width and tens of centimeters in length on an illumination surface and the illumination surface is scanned with the laser beam (i.e., the laser beam illumination position is moved relative to the illumination surface).

In particular, in contrast to the case of using a spot-like laser beam that requires two-dimensional scanning, the use of a linear laser beam allows the entire illumination surface to be illuminated by one-dimensional scanning in the direction perpendicular to the longitudinal direction of the linear laser beam, whereby high mass-productivity is obtained. The scanning in the direction perpendicular to the longitudinal direction is employed because it is most efficient. Because of the high mass-productivity, the use of a linear laser beam is now becoming the mainstream in the laser annealing technology.

Laser-annealing a non-single crystal semiconductor film by scanning it with pulse laser beams that have been processed into a linear shape have several problems.

For example, there is a problem that, in general, when a laser beam is applied to the surface of a semiconductor coating formed on a substrate that has differences in height due to undulation or the like of the substrate, the laser beam does not focus on the surface locally.

This problem causes a case that laser annealing is not performed uniformly over the entire film surface. For example, when a linear laser beam is used in laser annealing, there occurs a marked phenomenon that stripes are formed at overlapping portions of beams. The semiconductor characteristics of the film vary very much from one stripe to another.

This problem is particularly serious in a case where laser light is applied to large-area substrates, because differences in height are relatively large in large-area substrates. For example, a substrate of 600 mm×720 mm has undulation of about 100 μm, which is very large for a laser beam used having a certain kind of feature.

A specific state of a laser beam in the vicinity of the focal point will be described below. The energy profile, at and in the vicinity of the focal point, of a laser beam depends on the form of an optical system that produces the laser beam.

For example, in the case of a beam produced by simply converging a laser beam into a linear shape, a deviation from the focal point affects the beam width and the energy density. FIG. 1A shows an optical system that simply converge a laser beam into a linear shape. Reference numeral 100 denotes a laser beam, 101 and 102 denote cylindrical lenses for expanding the laser 100, and 103 denotes a cylindrical lens for converging it in the width direction.

In general, in this type of optical system, the energy uniformity on an illumination surface 104 is poor because the laser beam 100 is simply converged into a linear shape. When this type of optical system is used, it is required that the laser beam 100 before being processed into a linear shape be very high in energy uniformity. Since a deviation from the focal point varies the energy density on the illumination surface 104, it is not desirable to form a laser beam by an optical system having the above type of configuration.

FIG. 1B shows an optical system in which a concave cylindrical lens 105 is added to the optical system of FIG. 1A. In a case where a linear beam is formed in the manner shown in FIG. 1B, the concept "focal point of a laser beam" itself is meaningless because the laser beam is parallel in the vicinity of an illumination surface 106. Therefore, the problem of a deviation from the focal point does not occur either. However, the laser beam energy density is high at the lens 105 from which a linear laser beam is output, and the lens 105 is not so durable as to sustain such a high energy density. Therefore, at present, this type of optical system is not practical. Further, when this type of optical system is used, it is required that an original laser beam (i.e., a laser beam before being processed into a linear shape) be very high in energy uniformity.

In the above two examples, it is required that a laser beam before being processed into a linear shape be very high in energy uniformity. At present, no laser beam generating device is available that generates a laser beam having sufficiently high uniformity for the purpose of annealing a semiconductor film. The above configurations thus require development of a new technology.

Because of low uniformity in the energy profile of a linear laser beam, at present the above two examples are not suitable for annealing of a semiconductor film. Next, a description will be made of examples of optical systems that are currently in actual use.

An optical system having a configuration shown in FIG. 2A forms a linear laser beam. The configuration of this optical system is such that a laser beam is divided vertically and horizontally and divisional beams are combined into a single beam on an illumination surface while being processed into a linear shape individually. This configuration makes it possible to uniformize the energy profile of a linear laser beam.

FIGS. 3A–3C show energy profiles, in the width direction, of a linear laser beam formed by the lens group of FIG. 2A at the focal point (combined focal point) and positions slightly deviated from the focal point. In the cross-sections at the positions slightly deviated from the combined focal point, the energy profile assumes a step-like shape because divisional beams are not completely combined into a single beam.

FIGS. 3A–3C show energy profiles at a position immediately upstream of the focal point, at the focal point, and at a position immediately downstream of the focal point, respectively, and correspond to broken lines a–c in FIG. 2B, respectively. The term "focal point of a linear laser beam" as used here means a plane where divisional beams are substantially combined into a single beam. In many cases, the width of a linear laser beam is set at 1 mm or less, because it is generally required to have high energy density. Therefore, the beam shapes shown in FIGS. 3A and 3C are approximately congruent with each other.

When a laser beam having the energy profiles as shown in FIGS. 3A–3C is applied to a semiconductor film, the annealing effect at a position where a central portion, in the width direction, of the linear laser beam is applied is entirely different from that at a position where an end portion of the linear laser beam is applied. To perform laser annealing by using such a laser beam with as high a level of uniformity as possible, a measure is commonly taken that laser beams are applied to a semiconductor film while being superimposed on each other.

Good results are obtained by superimposing linear laser beams on each other so that a portion of a semiconductor film that has been illuminated with an end portion of one linear laser beam is again illuminated with a central portion, in the width direction, of another linear laser beam. Since a laser generating device used is an excimer laser which is a pulsed laser, the entire semiconductor film can be illuminated with laser light by superimposing linear laser beams on each other on the semiconductor film.

To anneal the entire semiconductor film by using linear laser beams of the above kind with a highest level of uniformity, it is important to superimpose illumination regions of respective linear laser beams while moving the semiconductor film at a pitch x that is 1/20 to 1/5 of the width W of the linear laser beams. That is, it is necessary to apply laser beams so as to satisfy a condition $W/20 \leq x \leq W/5$.

Particularly good results are obtained by superimposing laser beams at a pitch x that is approximately 1/10 of the width W. However, even if laser illumination is performed under such a condition, there still occurs a marked phenomenon that stripes are formed at overlapping portions of beams.

FIG. 4 shows such stripes formed on a 5-inch-square substrate of 0.7 mm in thickness. The substrate had asperity (undulation) of about 20 $\mu$m. The stripes are seen depending on the manner of reflection when the surface of a laser-annealed silicon film is observed.

The stripes of FIG. 4 appeared when linear, XeCl excimer laser beams extending in the right-left direction in FIG. 4 were applied with scanning in the top-to-bottom direction in FIG. 4.

It is considered that the horizontal stripes of FIG. 4 result from the manner of overlapping of shots of pulse laser beams.

When an active matrix liquid crystal display was manufactured by forming thin-film transistors by using a silicon film having a stripe pattern as shown in FIG. 4, there occurred a problem that similar stripes appeared in a displayed image.

This problem is more serious in a large-area (600 mm×720 mm) substrate of 0.7 mm in thickness because the surface has differences in height of about 100 $\mu$m.

In general, in forming a linear laser beam, a laser beam having a rectangular cross-section is processed into a linear shape by causing it to pass through a proper optical system. A rectangular beam having an aspect ratio of 2 to 5 is shaped into a linear beam having an aspect ratio of 100 or more by an optical system shown in FIG. 2A, for example. The optical system of FIG. 2A is so designed as to also uniformize the beam energy profile.

The apparatus shown in FIG. 2A has a function of applying, to an illumination surface, a linear beam that has been obtained by shaping a laser beam (generally rectangular in this state) emitted by an oscillator 201 by an optical system having lenses 202–204, 206, and 208. Reference numerals 205 and 207 denote a slit and a mirror, respectively.

The cylindrical lens group (also called a multi-cylindrical lens) 202 has a function of dividing a beam into many beams. The many divisional beams are combined by the cylindrical lens 206 as the final lens.

This structure is required to improve the uniformity of the beam intensity profile. The combination of the cylindrical lens group 203 and the cylindrical lens 204 has basically the same function as the combination of the cylindrical lens group 202 and the cylindrical lens 206.

That is, while the combination of the cylindrical lens group 202 and the cylindrical lens 206 has a function of improving the uniformity of the intensity profile in the longitudinal direction of a linear laser beam, the combination of the cylindrical lens group 203 and the cylindrical lens 204 has a function of improving the uniformity of the intensity profile in the width direction of a linear laser beam.

An optical system having a role of uniformizing the beam energy profile is called a beam homogenizer. The above-described optical systems shown in FIG. 2A are beam homogenizers. The energy profile is uniformized by dividing an original rectangular beam, expanding divisional beams, and superimposing the expanded divisional beams one on another.

A linear laser beam formed by the above optical system has energy profiles as shown in FIGS. 3A–3C at the focal point and the positions slightly deviated therefrom. As seen from FIGS. 3A–3C, the energy profiles at the positions slightly deviated from the focal point are different from that at the focal point. These differences further the formation of a stripe pattern.

The configuration of the lenses shown in FIG. 2A is the basic one, and another optical system may be added thereto or part of the lenses may be replaced by other lenses having a similar action. Or the configuration of FIG. 2A may be used as part of the entire optical system. For example, the cylindrical lens group 202 and the cylindrical lens 203 which are convex lenses may be replaced by concave lenses or concave/convex-mixed lenses.

Where lenses that are not congruous with each other as typified by concave/convex-mixed lenses are used, the lenses should have such structures that beams obtained by the lenses by processing a parallel beam have the same divergent angle. Otherwise, when divisional beams are recombined, beams having different sizes and shapes are superimposed one on another, as a result of which the outline of a resulting beam becomes unclear.

A laser beam may be divided by other methods than using a cylindrical lens. For example, as shown in FIG. 10, the cylindrical lens group 203 and the cylindrical lens 204 shown in FIG. 2A may be replaced by a multi-phase prism 1001 having approximately the same action. Because of a decrease in the number of lenses, this optical system has several merits. For example, the loss of light quantity can be reduced and the alignment adjustment of the optical system can be made easier.

An object of the invention is to reduce the degree of unevenness in laser light illumination as shown in FIG. 4.

Another object of the invention is to provide an optical system which can prevent unevenness in laser light illumination by minimizing a variation in energy profile in the vicinity of the focal point of a laser beam (see FIGS. 3A–3C).

FIG. 2B shows an optical path of a laser beam from the cylindrical lens (hereinafter referred to as "final lens") 208 that is disposed at the end of the optical system having the optical system of FIG. 2A as the basis to the illumination surface. FIG. 2B shows how a plurality of beams are combined into a single linear beam on the illumination surface. If the illumination surface is deviated from, that is, located upstream or downstream of, the combined focal point (i.e., the focal point of the entire optical system), that is, if the distance of the illumination surface from the final lens is varied, a plurality of laser beams are not completely combined into a single beam and hence a variation occurs in the energy profile. The cross-sections a–c shown in FIG. 2B correspond to the energy profiles of FIGS. 3A–3C, respectively.

Where a substrate of 600 mm×720 mm is used, in many cases the height difference r of a semiconductor film to be illuminated amounts to about 100 $\mu$m when the substrate is placed on a flat stage. In this case, it is necessary to design an optical system that prevents the crystallization state of a semiconductor film from reflecting a deviation from the focal point in the ranges having a length 100/2=500 $\mu$m that are immediately upstream of and downstream of the combined focal point of a laser beam.

For convenience in substrate transport, it is preferable that the stage to be mounted with a substrate be of a 3-point support type (depending on the rigidity of a substrate, there may occur a case that supporting at four or more points is even preferable). However, a substrate mounted on such a stage is warped and is thereby increased in undulation (the substrate has undulation originally). In such case, naturally it is necessary to perform laser annealing by using a laser beam that enables satisfactory crystallization even if undulation of such a level exists. When a substrate of 600 mm×720 mm in size and 0.7 mm in thickness was mounted on a 3-point support stage, the substrate surface had apparent height differences of about 1,000 $\mu$m.

FIGS. 5A and 5B show two final lenses having different focal lengths. It is seen from optical paths of laser beams that pass through the two final lenses that the variation in the energy profile of a laser beam in the vicinity of the illumination surface is smaller when the ratio of the distance F between the generatrix of the final lens and the semiconductor film to the size D, in the direction perpendicular to the generatrix of the final lens, of a region on the final lens on which the laser beam is incident is larger.

This point will be described below with reference to FIGS. 5A and 5B. In FIGS. 5A and 5B, symbol z represents a distance between two beam cross-sections that are located close to and on both sides of the combined focal point and in which the beam width is w* (the beam width is W at the focal point).

A relationship $z1 \leq z2$ holds when $F1/D1 \leq F2/D2$. That is, the variation in beam width with respect to the deviation from the combined focal point is smaller in the case of FIG. 5B.

At the positions deviated from the combined focal point by z/2, the beam width of a linear laser beam decreases by $\Delta = W - w^*$ from that at the combined focal point. Since $D >> W$, an approximation $\Delta(z) = (z/2) \times D/F$ can be made.

As shown in FIGS. 3A–3C, the bean width w* at a position deviated upstream or downstream from the combined focal point by z/2 is defined as a width of a region where the energy density is substantially the same as at the combined focal point. In this specification, parameter $\Delta$ is called a beam width variation amount.

Symbol $\Delta(r)$, rather than $\Delta$, particularly means a beam width variation amount that occurs when a laser beam is applied to a semiconductor film having a height difference r.

SUMMARY OF THE INVENTION

As described above, the beam width varies by $\Delta$ at a position distant from the combined focal point by z/2. It is the common understanding in the art that striped laser beam illumination unevenness is least noticeable if linear laser beams are superimposed one on another with a pitch x that is about 1/10 of the laser beam width.

However, the inventors have empirically found that the illumination uniformity is much impaired if laser beams are applied under such $\Delta$ condition that A is larger than the pitch x.

That is, the inventors have found that uniform laser annealing can be attained by performing laser illumination under conditions that $W/20 \leq x \leq W/5$ and $x \leq \Delta$.

The present invention is intended to makes it possible to perform uniform laser annealing on a semiconductor film by providing an optimum combination of parameters that include the beam width W, the movement distance (pitch) x of an illumination surface during the oscillation period of a pulsed laser light source, the size D, in the direction perpendicular to the generatrix of the final lens of an optical system, of a beam incident region of the final lens, the distance F between the generatrix of the final lens and the semiconductor film, and the height difference r of the semiconductor film to be illuminated.

To attain the above objects, according to a first aspect of the invention, there is provided a laser illumination apparatus which illuminates a semiconductor film with a linear laser beam while scanning the semiconductor film with the linear laser beam, comprising a pulsed laser light source; an optical system for generating a linear laser beam having a beam width W by dividing a pulse laser beam that is emitted from the pulsed laser light source into a plurality of beams vertically and horizontally and combining divisional beams after they have been processed into a linear shape individually; and means for moving a substrate that is mounted with the semiconductor film, wherein a condition $W/20 \leq \Delta(r) \leq x \leq W/5$ is satisfied, where r is a height difference of a surface of the semiconductor film, $\Delta(r)$ is a variation amount of the beam width W as a function of the height difference r, and x is a movement distance of the substrate during an oscillation period of the pulsed laser light source.

According to a second aspect of the invention, there is provided a laser illumination apparatus which illuminates a semiconductor film with a linear laser beam while scanning the semiconductor film with the linear laser beam, comprising a pulsed laser light source; an optical system for generating a linear laser beam having a beam width W by dividing a pulse laser beam that is emitted from the pulsed laser light source into a plurality of beams vertically and horizontally and combining divisional beams after they have been processed into a linear shape individually; and means for moving a substrate that is mounted with the semiconductor film, wherein a condition $\Delta(r) \leq W/20 \leq x \leq W/5$ is satisfied, where r is a height difference of a surface of the semiconductor film, $\Delta(r)$ is a variation amount of the beam width W as a function of the height difference r, and x is a movement distance of the substrate during an oscillation period of the pulsed laser light source.

According to a third aspect of the invention, there is provided a laser illumination apparatus which illuminates a semiconductor film with a linear laser beam while scanning the semiconductor film with the linear laser beam, comprising a pulsed laser light source; an optical system for generating a linear laser beam having a beam width W by dividing a pulse laser beam that is emitted from the pulsed laser light source into a plurality of beams vertically and horizontally and combining divisional beams after they have been processed into a linear shape individually; and means for moving a substrate that is mounted with the semiconductor film, wherein a condition $W/20 \leq rD/2F \leq x \leq W/5$ is satisfied, where r is a height difference of a surface of the semiconductor film, D is a dimension, in a direction perpendicular to a generatrix of a final lens of the optical system, of a beam incident region of the final lens, F is a distance between the generatrix of the final lens and the semiconductor film, and x is a movement distance of the substrate during an oscillation period of the pulsed laser light source.

According to a fourth aspect of the invention, there is provided a laser illumination apparatus which illuminates a semiconductor film with a linear laser beam while scanning the semiconductor film with the linear laser beam, comprising a pulsed laser light source; an optical system for generating a linear laser beam having a beam width W by dividing a pulse laser beam that is emitted from the pulsed laser light source into a plurality of beams vertically and horizontally and combining divisional beams after they have been processed into a linear shape individually; and means for moving a substrate that is mounted with the semiconductor film, wherein a condition $rD/2F \leq W/20 \leq x \leq W/5$ is satisfied, where r is a height difference of a surface of the semiconductor film, D is a dimension, in a direction perpendicular to a generatrix of a final lens of the optical system, of a beam incident region of the final lens, F is a distance between the generatrix of the final lens and the semiconductor film, and x is a movement distance of the substrate during an oscillation period of the pulsed laser light source.

The above apparatuses are particularly effective when the height difference r satisfies a relationship $r \leq 1,000$ μm. A most remarkable effect can be obtained when a relationship $r \leq 100$ μm is satisfied.

In the above apparatuses, the laser annealing uniformity in the surface is effectively improved when the substrate size is in a range of 100 mm×100 mm to 1,000 mm to 1,000 mm. Most remarkable uniformity improvement effect can be obtained when the substrate size is in a range of 300 mm×300 mm to 800 mm to 800 mm. The effect is further enhanced when the substrate thickness is 1.5 mm or less.

The optimum condition in the range of $W/20 \leq x \leq W/5$ varies depending on the states of a semiconductor film to be illuminated (e.g., the hydrogen concentration of the film). Therefore, as long as the condition $W/20 \leq \Delta \leq x \leq W/5$ should be satisfied, there may occur a case that the selection rage of x becomes narrow and a sufficiently high level of uniformity cannot be obtained.

On the other hand, when the condition $\Delta \leq W/20 \leq x \leq W/5$ should be satisfied, the movement distance (pitch) x can be selected freely within the range of $W/20 \leq x \leq W/5$. Therefore, laser annealing can be performed under the optimum condition for every semiconductor film.

For example, when an active matrix liquid crystal display was manufactured that had, as pixel switching elemets, thin-film transistors formed by using a semiconductor film that was laser-crystallized in such a manner that the condition $\Delta \leq W/20 \leq x \leq W/5$ was satisfied, no noticeable stripe pattern appeared on the screen.

If the height difference r of an illumination surface is taken into consideration, it is understood from the formula $W/20 \leq \Delta \leq x \leq W/5$ that it is preferable that at least the condition $\Delta \leq W/5$ be satisfied as shown in FIG. 6.

If the height difference r of an illumination surface is taken into consideration, it is understood from the formula $\Delta \leq W/20 \leq x \leq W/5$ that it is even preferable that at least the condition $\Delta \leq W/20$ be satisfied.

As described above, the above-mentioned beam width variation amount $\Delta(r)$ is defined by $\Delta(r)=(r/2)\times(D/F)$.

The above conditions apply when the center of height differences of the surface of a semiconductor film is located at the focal point of a linear laser beam. In other situations, the conditions may become stricter. It is preferable that the position of a stage be finely adjustable in the vertical direction for positioning to establish such a situation.

In crystallizing or improving the crystallinity of a semiconductor film by illuminating it with laser light, the invention makes it possible to perform laser annealing uniformly in the substrate surface even if the surface of the semiconductor film has height differences due to asperity, undulation, or the like of the substrate.

For example, the energy distribution of a linear laser beam formed by the optical system of FIG. 2A at positions slightly deviated upstream and downstream from the focal point (combined focal point) of the linear laser beam varies from that at the focal point as shown in FIGS. 3A–3C.

If such a linear laser beam is applied to a semiconductor film having height differences, the film comes to directly reflect a variation in the energy distribution of the linear laser beam and hence annealing cannot be performed uniformly.

According to the invention, the linear laser beam forming condition can be obtained in accordance with the undulation state of the surface of a semiconductor film as a laser illumination object, as a result of which laser annealing can be performed with a higher level of uniformity.

The above constitution of the invention is particularly effective in a case where a laser beam whose aspect ratio is not very large is processed into a linear laser beam having an aspect ratio of 100 or more by an optical system that divides the original laser beam into a plurality of beams vertically and horizontally and combines divisional beams into a beam width W after they have been shaped into a linear shape individually.

If such a device as a TFT liquid crystal display is manufactured by using a polycrystalline semiconductor film that has been formed by laser-annealing a semiconductor film by using the laser illumination apparatus of the invention, the device can exhibit high image quality because variations in characteristics among TFTs are reduced.

If a semiconductor integrated circuit is manufactured by using the illumination apparatus of the invention, the circuit can exhibit high performance because the characteristics of elements formed on the same base member can be equalized.

BRIEF DESCRIPTION OF THE DRAWINGS

FIGS. 1A and 1B show examples of conventional optical systems for forming a linear laser beam;

DETAILED DESCRIPTION OF THE PREFERRED EMBODIMENTS

Embodiment 1

Figure 2A:
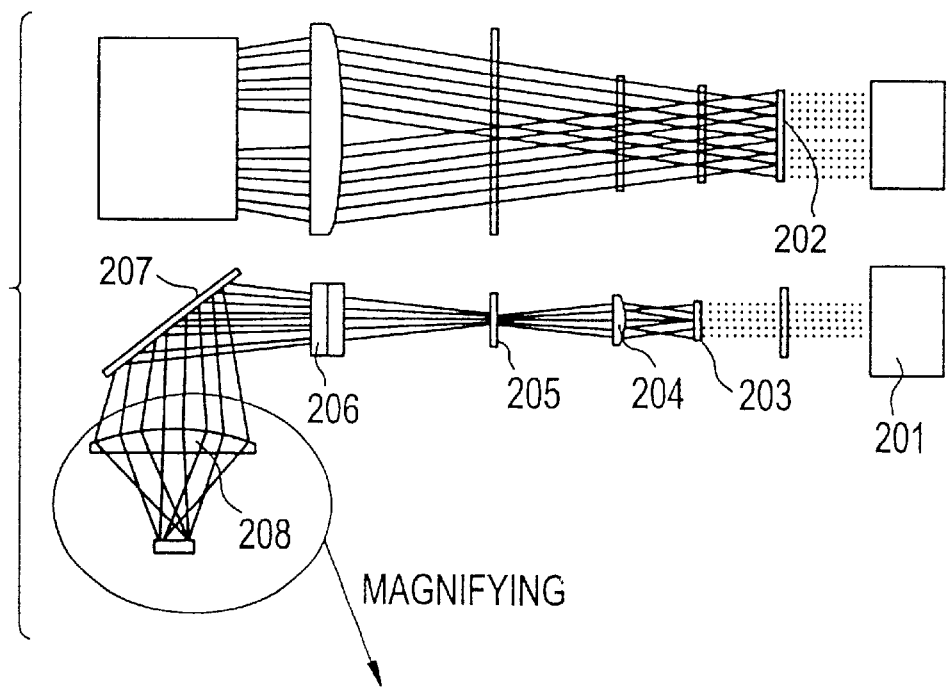
FIGS. 2A and 2B show another conventional optical system for forming a linear laser beam, as well as its optical path.
Figure 2B:
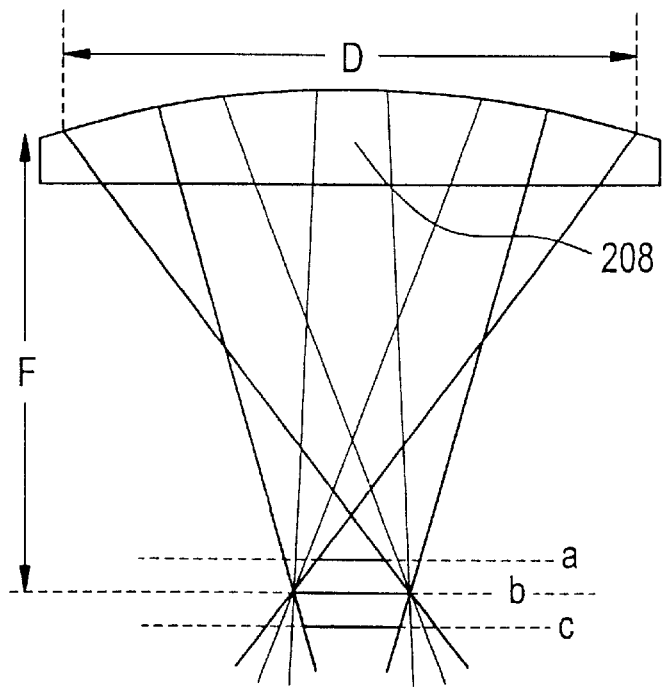
Figure 3A:
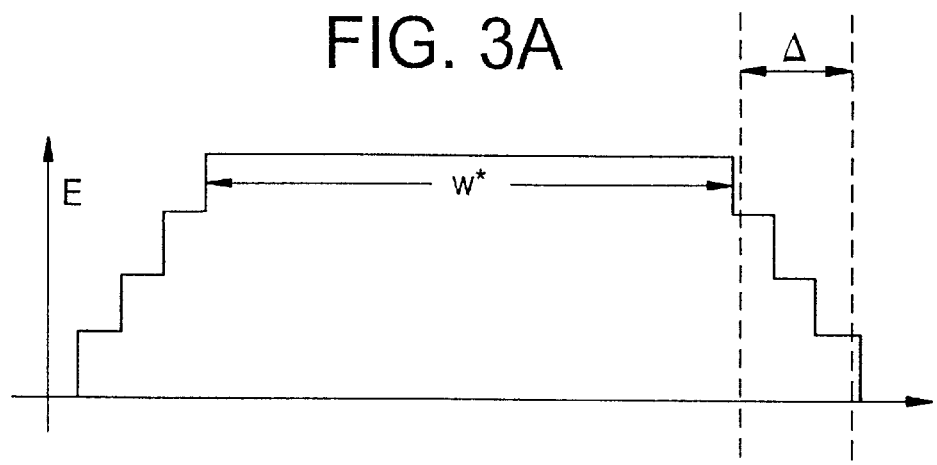
FIGS. 3A–3C show energy profiles, in the width direction, at the focal point and positions slightly deviated therefrom, of a linear laser beam formed by the optical system of FIG. 2A.
Figure 3B:
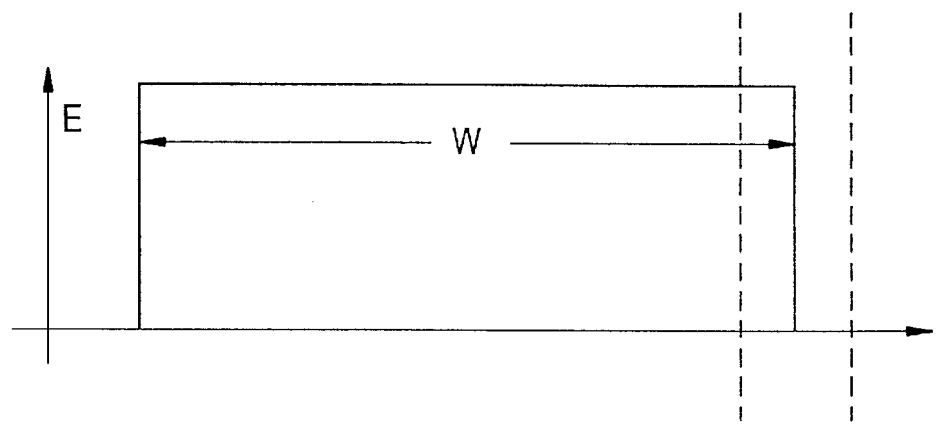
Figure 3C:
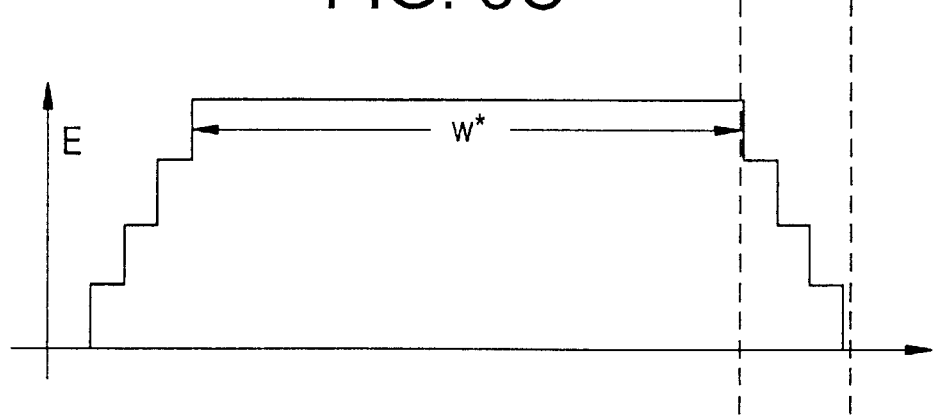
Figure 4:
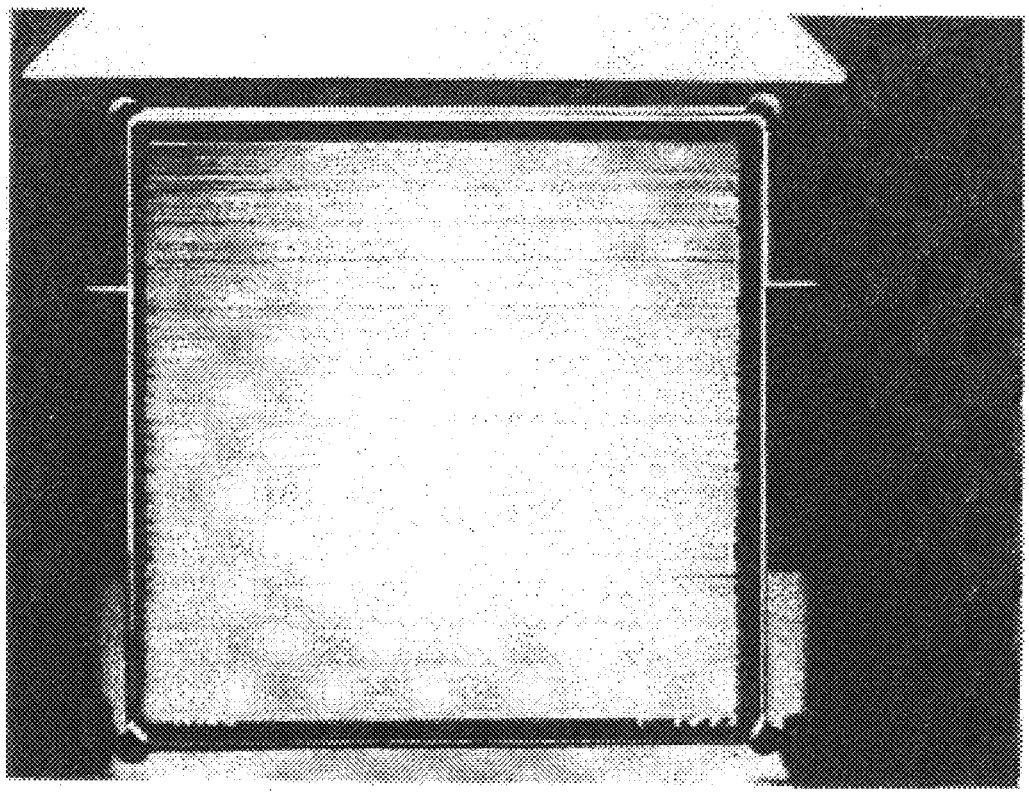
FIG. 4 is a photograph of a silicon thin film that has been laser-crystallized by linear laser beams.
Figure 5A:
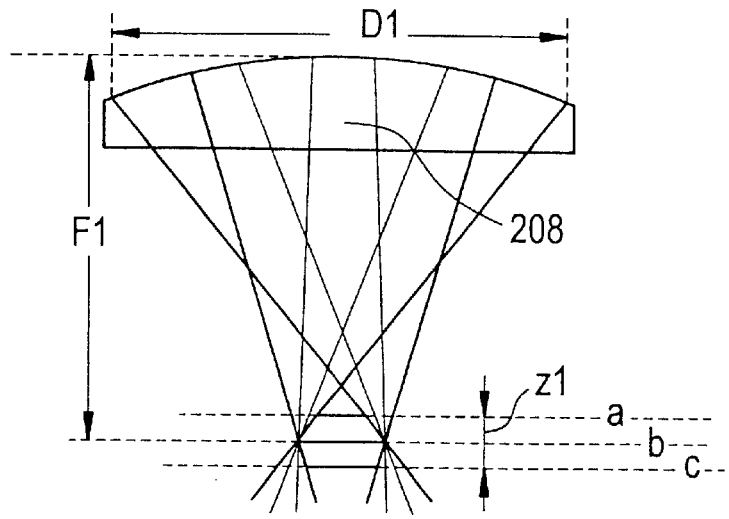
FIGS. 5A and 5B show a difference in laser beam optical path due to a difference in the shape of a final lens.
Figure 5B:
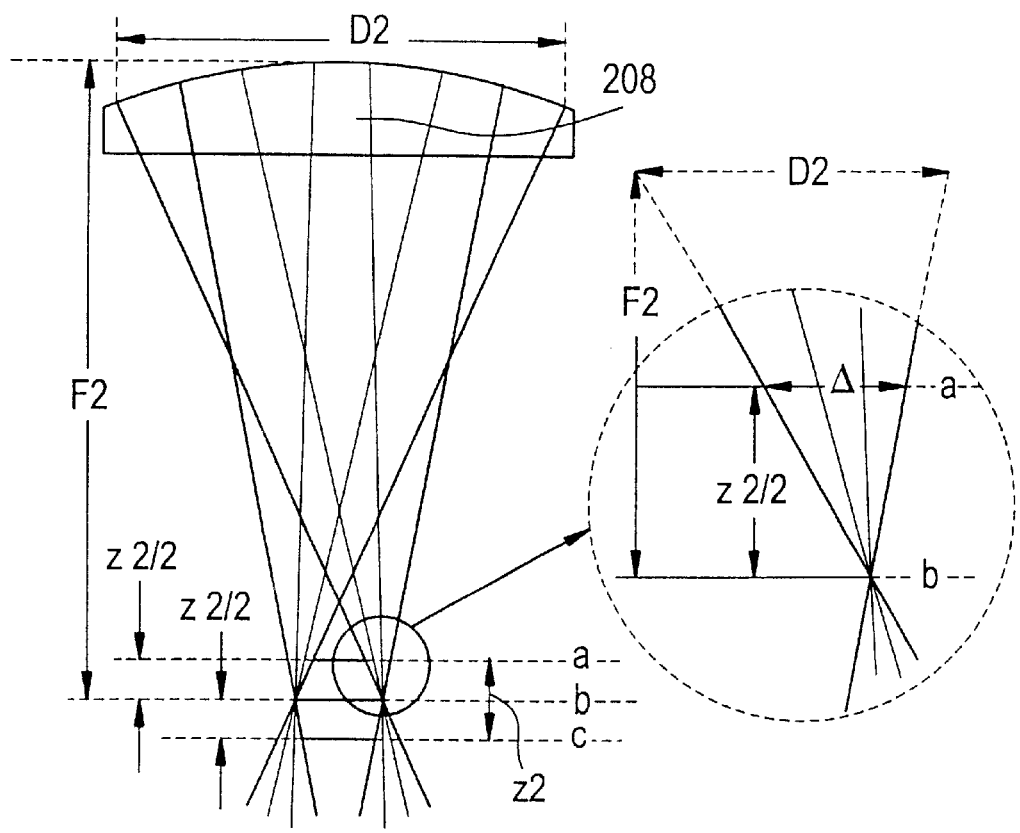
Figure 6:
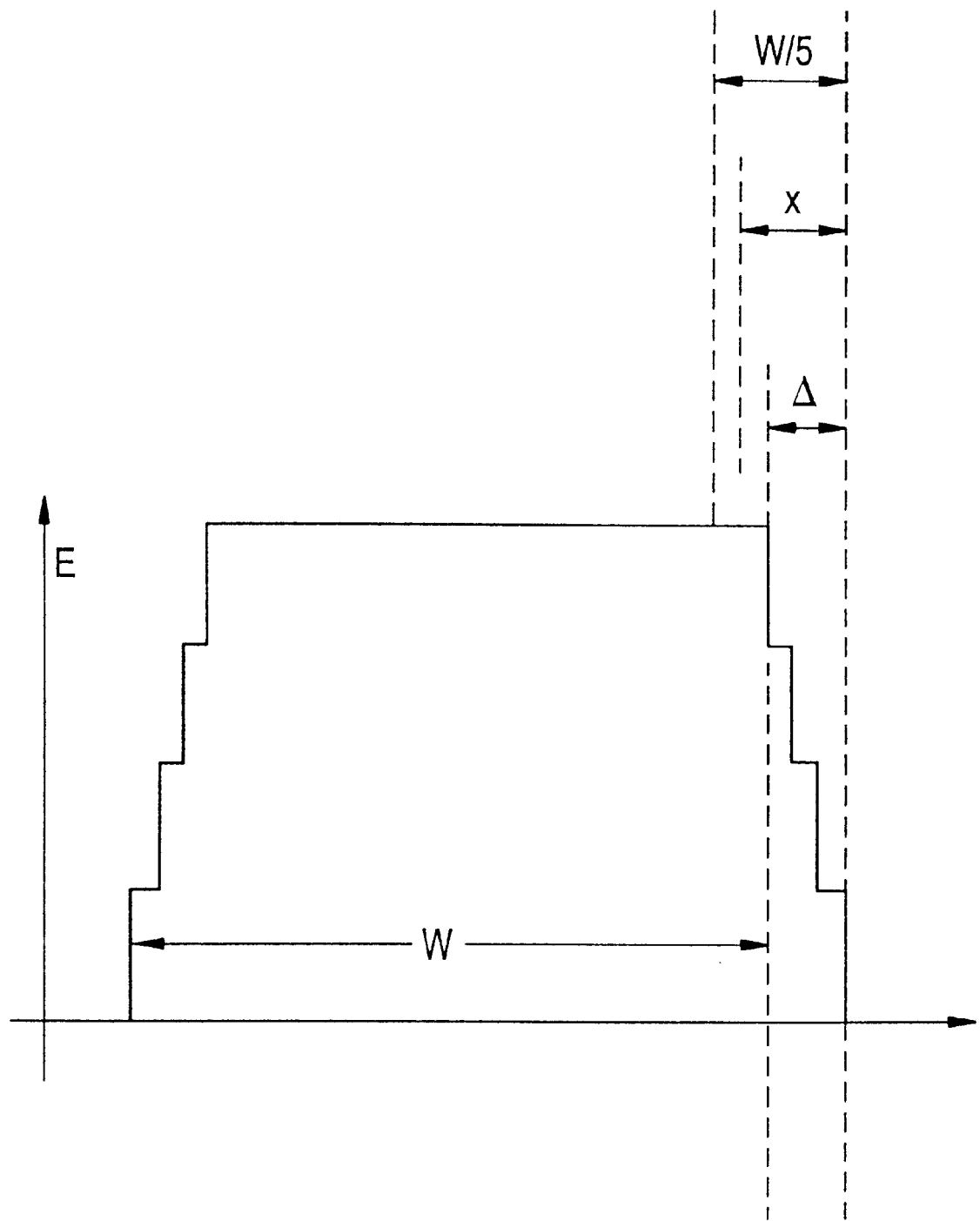
FIG. 6 shows a relationship among a width W of a linear laser beam, a beam width variation amount Δ, and a pitch x.

First, methods of forming films to be subjected to laser illumination will be described, which correspond to steps as part of a manufacturing process of this embodiment. Three kinds of films will be described in the specification as films to be subjected to laser illumination. The invention is effective for each of those films.

First, to form each of three kinds of films, a 200-nm-thick silicon oxide film as an undercoat film is formed on a Corning 1737 glass substrate of 600 mm×720 mm in size and 0.7 mm in thickness and a 50-nm-thick amorphous silicon film is formed thereon by plasma CVD. This film is hereinafter called a starting film.
(Film A forming procedure)

The starting film is subjected to hot bathing of 500° C. and 1 hour. This step is executed to reduce the hydrogen concentration of the amorphous silicon film. This step is necessary because a film having too high a hydrogen concentration cannot sustain laser light energy.

It is proper that the hydrogen concentration of the film be in the order of $10^{20}$ atoms/cm$^3$. This film is called a non-single-crystal silicon film A.

(Film B forming procedure)

A 10-ppm nickel acetate aqueous solution is applied to the starting film by spin coating, to form a nickel acetate layer. It is preferable to add a surfactant to the nickel acetate aqueous solution. Since the nickel acetate solution is extremely thin, it does not necessarily assume a film form. However, even if it does not assume a film form, no problems will occur in the subsequent steps.

Then, the substrate on which the films have been laid one on another in the above manner is subjected to thermal annealing of 550° C. and 4 hours. As a result, the amorphous silicon film is crystallized and a crystalline silicon film as a non-single-crystal silicon film B is formed.

In the above step, nickel as a catalyst element serves as nuclei of crystal growth and thereby accelerates the crystallization. The fact that the crystallization can be performed at a low temperature (550° C.) in a short time (4 hours) is due to the function of nickel. The details of this technique are described in Japanese Unexamined Patent Publication No. Hei. 6-244104.

It is preferable that the concentration of the catalyst element be $1\times10^{15}$ to $1\times10^{19}$ atoms/cm$^3$. At a high concentration higher than $1\times10^{19}$ atoms/cm$^3$, the crystalline silicon film exhibits metal properties and loses semiconductor properties. In this embodiment, the concentration of the catalyst element in the crystalline silicon film is $1\times10^{17}$ to $5\times10^{18}$ atoms/cm$^3$ in terms of a minimum value in the film. These values are ones obtained by analysis and measurement by the secondary ion mass spectroscopy (SIMS).
(Film C forming procedure)

A 700-Å-thick silicon oxide film is formed on the starting film by plasma CVD.

Then, an opening is formed through the silicon oxide film by photolithography/patterning.

Then, to form a thin oxide film in the opening, UV light is applied to the silicon oxide film for 5 minutes in an oxygen atmosphere. The thin oxide film is formed to improve the wettability in the opening with respect to a nickel acetate aqueous solution that will be introduced later.

Then, a 100-ppm nickel acetate aqueous solution is applied to the film by spin coating, whereupon nickel acetate goes into the opening. It is preferable to add a surfactant to the nickel acetate aqueous solution.

Then, thermal annealing is performed at 600° C. for 8 hours, whereby crystal growth occurs laterally from the nickel-introduced portion. In this step, nickel has basically the same role as in the case of forming the film B. Under the conditions of this embodiment, a lateral growth length of about 40 μm is obtained.

The amorphous silicon film is crystallized in the above manner and a crystalline silicon film as a non-single-crystal silicon film C is formed. Thereafter, the silicon oxide film on the crystalline silicon film is peeled off by using bufferred hydrofluoric acid.

Then, each of the non-single-crystal silicon films A–C thus formed will be crystallized in the following manner.

Each substrate on which the non-single-crystal film A, B, or C had minute undulation and the height difference of the surface of each non-single-crystal was about 100 μm.

To improve the crystallinity, laser annealing is performed by using an excimer laser.

Figure 7:
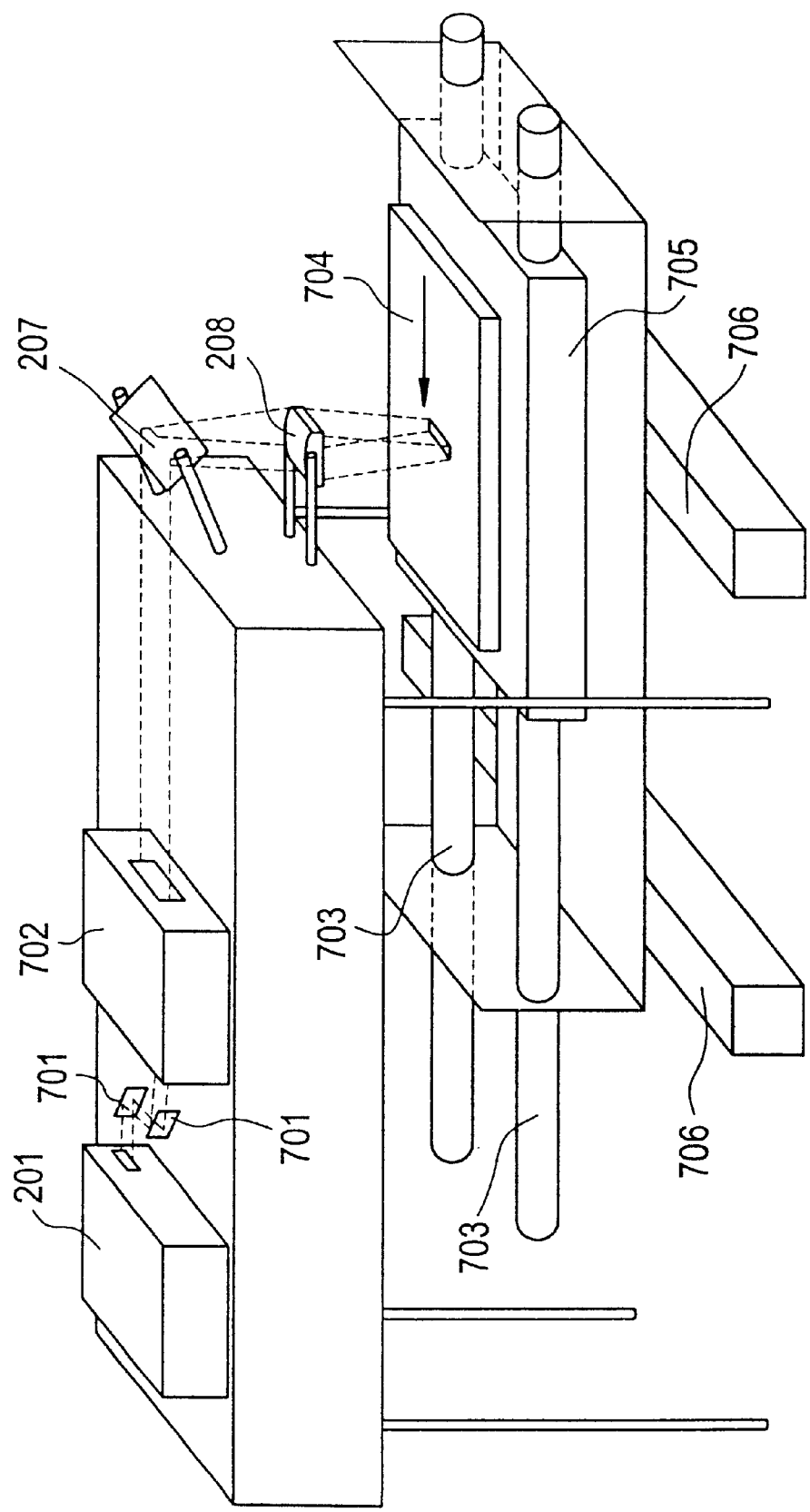
FIG. 7 shows a laser illumination apparatus used in a first embodiment of the present invention.

FIG. 7 shows a general appearance of a laser illumination system used in this embodiment.

As shown in FIG. 7, the laser illumination system has the following functions. A pulse laser beam is emitted from a laser oscillation device 201, subjected to a traveling direction adjustment by a pair of reflection mirrors 701, and then processed by an optical system 702 into a beam having a linear cross-section. The linear beam is reflected by a mirror 207 and then applied to a substrate 704 to be processed having an illumination surface while being converged by a cylindrical lens 208 as the final lens. A beam expander capable of reducing the beam divergent angle and adjusting the beam size may be disposed between the two reflection mirrors 701.

The optical system 702, the mirror 207, and the cylindrical lens 208 as the final lens are configured basically in the same manner as shown in FIG. 2A.

The optical system used in this embodiment is configured in the same manner as shown in FIG. 2A. This is because this optical system can process an incident beam into a linear beam while uniformizing the beam energy profile (the beam incident on the optical system is uneven in energy profile) by dividing the incident beam and superimposing divisional beams one on another.

In this embodiment, a XeCl excimer laser (wavelength: 308 nm) is used as the laser oscillation device 201 (pulsed laser light source). Alternatively, a KrF excimer laser (wavelength: 248 nm) or the like may be used.

The substrate 704 to be processed is mounted on a stage 705 having a flat top surface. The stage 704 is moved straightly by a moving mechanism 703 in the direction perpendicular to the longitudinal direction of a linear laser beam, to thereby makes it possible to illuminate the top surface of the substrate 704 with laser beams while scanning the top surface with the laser beams.

Since the linear laser beam is 150 mm in length, it cannot process a substrate of 600 mm×720 mm by one scan. Therefore, the entire surface of the substrate is laser-annealed by performing four scans successively. The stage 705 is slid by a scanning area changing device 706 by the beam length (in this embodiment, 150 mm) per one scan in the longitudinal direction of the linear laser beam.

The entire surface of the substrate of 600 mm×720 mm is illuminated with laser light by performing four scans successively with the substrate sliding operation performed in between.

The adjustment of the optical system is facilitated if the height of the stage 705 can be finely adjusted so that the focal point of the linear laser beam is located at a proper position with respect to the semiconductor film.

The fine adjustment may be performed while the energy profile of a one-shot laser beam is checked that is actually applied to the semiconductor film. An energy profile measuring device may be attached to the stage 705.

In FIG. 7, a linear laser beam of 0.5 mm in width and 150 mm in length is applied to the substrate 704 to be processed. This linear laser beam is formed by the lenses that are arranged as shown in FIG. 2A.

The energy density of a laser beam on the illumination surface is set in a range of 100–500 mJ/cm$^2$, for example, at 300 mJ/cm$^2$. The scanning with linear laser beams is performed by moving the stage 705 in one direction at 1.5 mm/s. In this embodiment, the oscillation frequency of the pulsed laser in the laser light source is set at 30 Hz.

In the laser illumination apparatus used in this embodiment, D is 90 mm, F is 275 mm, and the beam width of a linear laser beam is 500 μm.

As mentioned above, the height difference r of the non-single-crystal semiconductor film as the illumination surface is 100 μm.

Therefore, $\Delta(r)=rD/2F=(100\times90\times10^3)/(2\times275\times10^3)\approx16$ μm. Since W/5=100 μm and W/20=25 μm, a relationship $\Delta(r)\leq W/20\leq x\leq W/5$ holds.

Therefore, the movement distance (pitch) x of the illumination surface (or the stage 705) may be selected freely within the range of 25 μm≦x≦100 μm. As long as this condition is satisfied, laser annealing can be performed uniformly in the substrate surface.

Although Δ(r) was calculated above based on the configuration of the optical system, it goes without saying that it may be determined by an actual measurement.

There may occur a situation in which a relationship W/20≦Δ(r)≦x≦W/5 holds. Even under such a condition, laser annealing can be performed uniformly in the substrate surface. However, the selection range of the pitch x is narrow.

Figure 8:
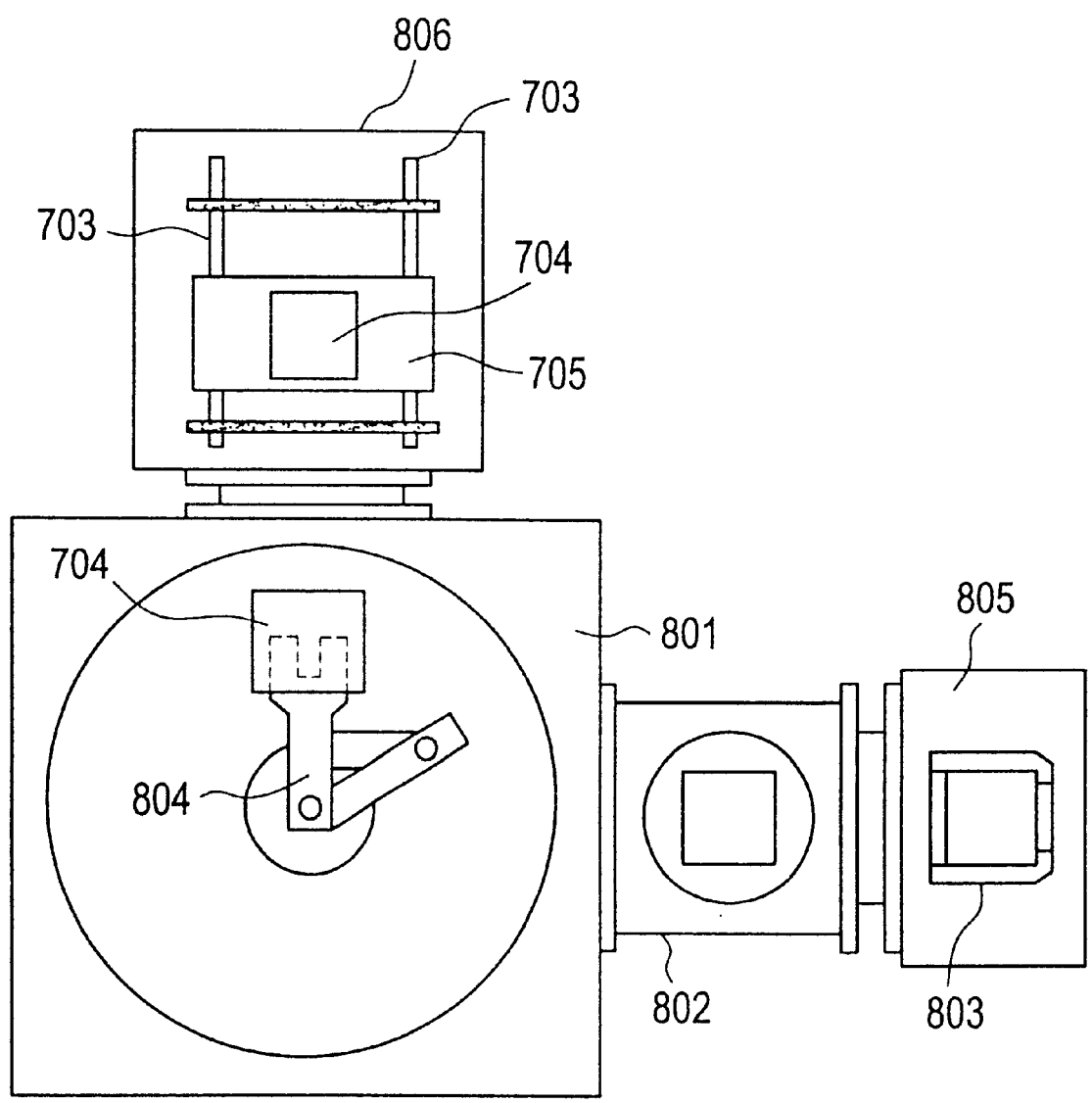
FIG. 8 shows a consecutive processing apparatus used in the first embodiment.

FIG. 8 shows a consecutive processing apparatus that is equipped with the laser illumination apparatus having the configuration shown in FIG. 7 and enables consecutive processing of substrates.

A cassette 803 accommodating a number of, for example, 20, substrates 704 to be processed is disposed in a load/unload chamber 805. One substrate 704 is taken from the cassette 803 and then moved to an alignment chamber 802 by a robot arm 804.

An alignment mechanism for modifying the positional relationship between the substrate 704 and the robot arm 804 is provided in the alignment chamber 802. The alignment chamber 802 is connected to the load/unload chamber 805.

The substrate 704 is carried to a substrate transport chamber 801 by the robot arm 804, and then transferred to a laser illumination chamber 806 by the robot arm 804.

The laser illumination apparatus having the configuration shown in FIG. 7 is disposed in the laser illumination chamber 806. To avoid making FIG. 8 unduly complex, the optical system is not drawn in FIG. 8.

After being subjected to laser illumination, the substrate 704 is returned to the substrate transport chamber 802 by the robot arm 804.

Thereafter, the substrate 704 is transferred to the load/unload chamber 805 by the robot arm 804 and then put into the cassette 803.

One laser annealing process is thus finished. By repeating the above process, a number of substrates can be processed consecutively one by one.

Semiconductor films that were laser-annealed according to this embodiment were crystallized uniformly in the substrate surface without occurrence of any unevenness.

Both of a p-channel TFT and an n-channel TFT can be manufactured by using, as an active layer, a semiconductor film that is laser-annealed in the above-described manner.

It is also possible to produce a structure that is a combination of an n-channel TFT and a p-channel TFT. Further, an electronic circuit can be constructed by integrating a number of TFTs.

The above also applies to a semiconductor film laser-annealed by using an optical system according to another embodiment. A 5-inch liquid crystal display manufactured by using TFTs that were formed by using a semiconductor thin film that were laser-annealed via the optical system of the invention exhibited high image quality with only small variations in characteristics among the TFTs.

Embodiment 2

This embodiment is directed to an apparatus and method for performing laser annealing uniformly as in the case of the first embodiment in such a manner that a substrate having the semiconductor film A, B, or C in the first embodiment is mounted on a 4-point-support stage rather than the flat stage.

When a substrate of 600 mm×720 mm in size and 0.7 mm in thickness is mounted on a 4-point-support stage, the height difference of the surface due to undulation of the substrate amounts to about 1,000 µm. Even at the occurrence of such a large height difference, annealing can be performed uniformly with almost no influence of the height difference as long as the above-mentioned condition is satisfied.

To place a substrate on the 4-point-support stage, the robot arm 804 is moved vertically, whereby the substrate can be left on the stage.

Figure 9:
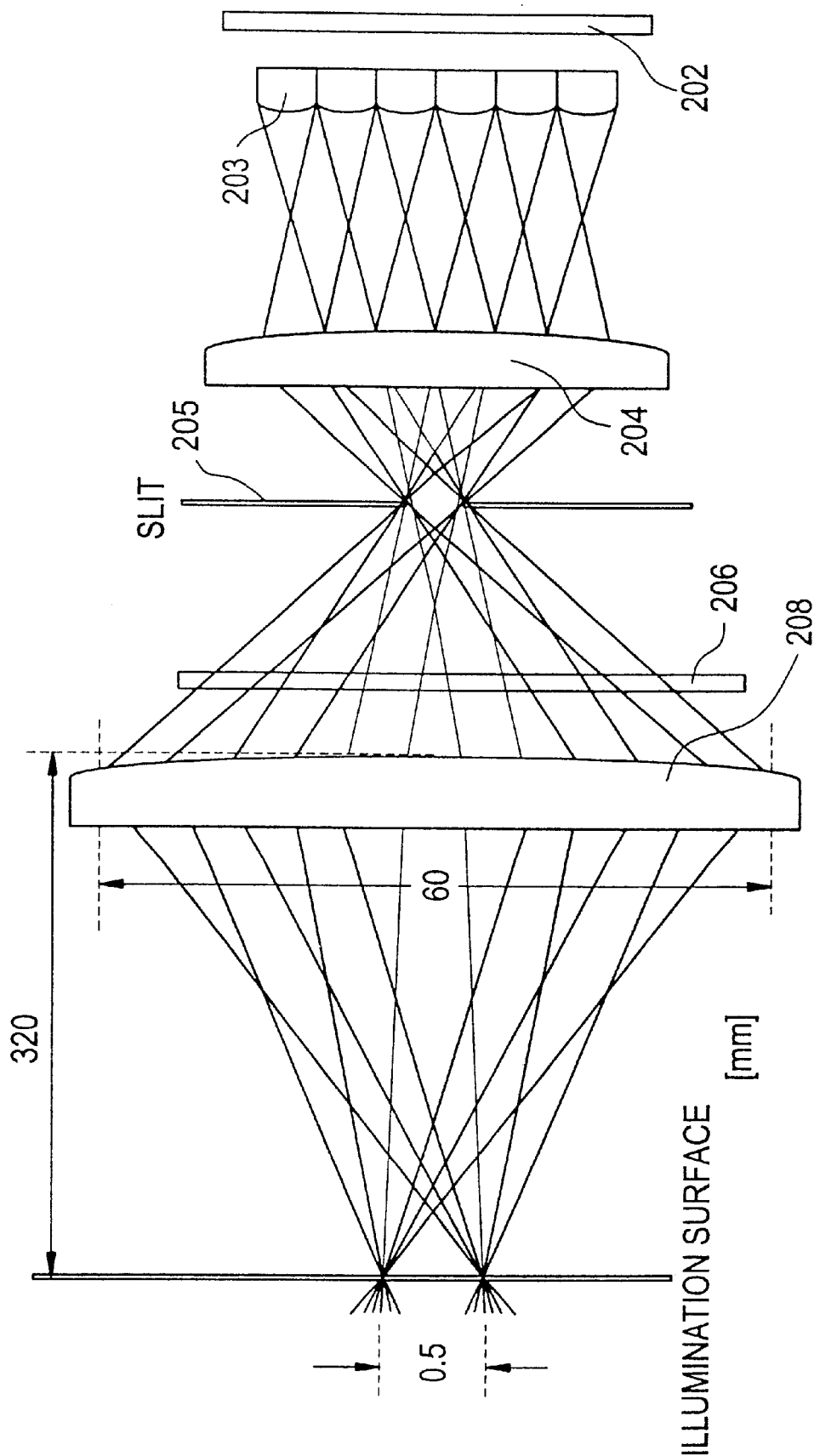
FIG. 9 shows an optical system according to a second embodiment of the invention for forming a linear laser beam, as well as its optical path.

This embodiment uses a laser optical system shown in FIG. 9. As in the case of the first embodiment, a laser beam formed by the laser optical system of FIG. 9 has a beam width 0.5 mm (W=500 µm) and a beam length 150 mm. D and F are 60 mm and 320 mm, respectively.

Therefore, $\Delta(r)=rD/2F=(1,000\times60\times10^3)/(2\times320\times10^3)=94$ µm. Since W/5=100 µm and W/20=25 µm, a relationship $W/20 \leq \Delta(r) \leq x \leq W/5$ holds.

Therefore, the movement distance (pitch) x of the illumination surface (or the stage 705) is restricted to the range of 94 µm $\leq x \leq$ 100 µm. As long as this condition is satisfied, laser annealing can be performed uniformly in the substrate surface.

Although $\Delta(r)$ was calculated above based on the configuration of the optical system, it goes without saying that it may be determined by an actual measurement.

Although the uniformity of a resulting semiconductor film was not as high as in the first embodiment, no problems occurred when, for example, a liquid crystal display was manufactured by using such a semiconductor film.

Embodiment 3

This embodiment is directed to an optical system that has basically the same characteristics as the laser optical systems of the first and second embodiments and has different configuration as the latter. In this embodiment, a multi-phase prism is used for processing a laser beam in its width direction.

Figure 10:
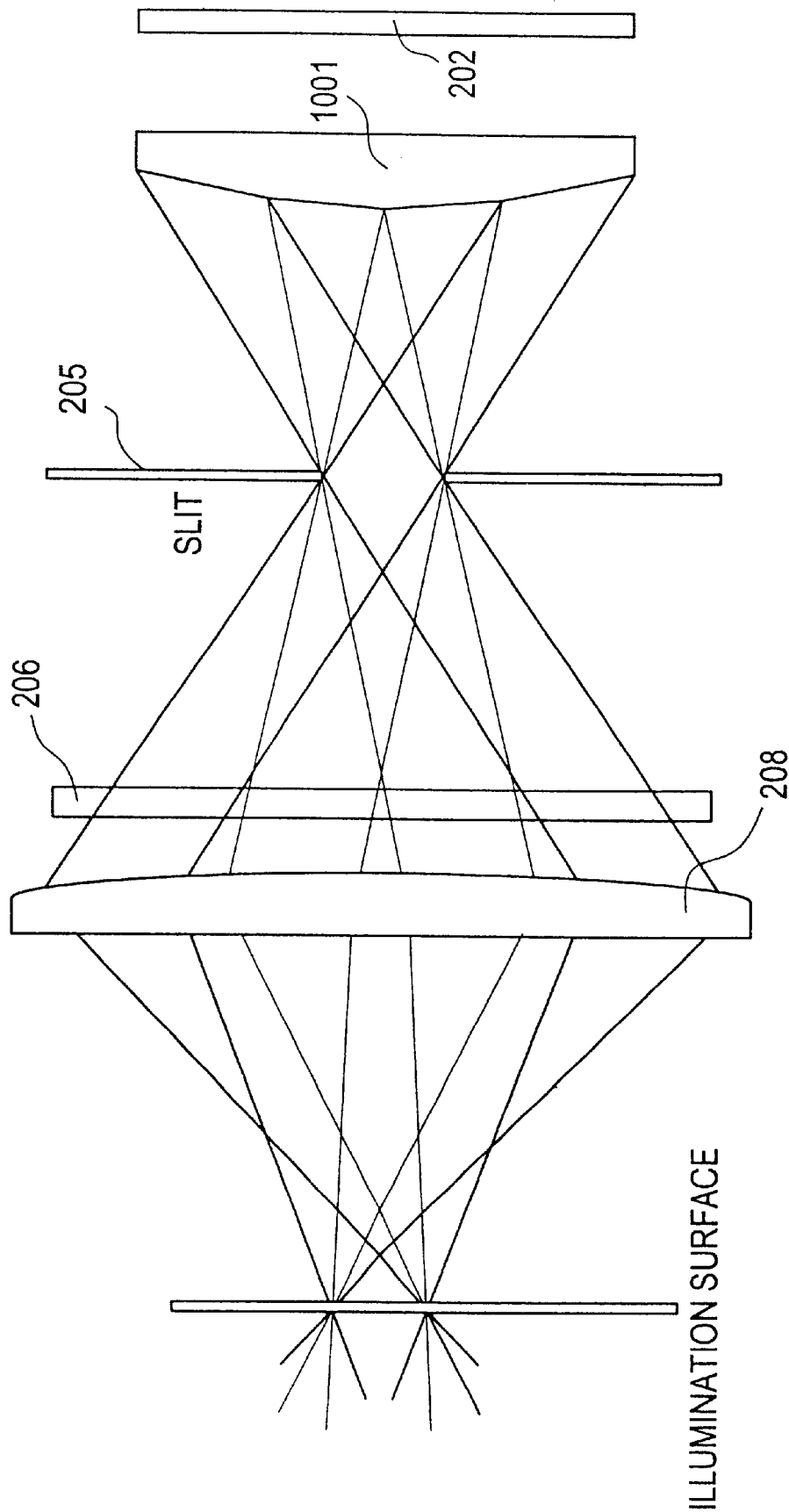
FIG. 10 shows an optical system according to a second embodiment of the invention for forming a linear laser beam, as well as its optical path.

A multi-phase prism 1001 is shown in FIG. 10. The merit of using this optical prism is that the number of lenses can be reduced. Reducing the number of lenses by one can facilitate the alignment adjustment of the optical system and lower the loss of light quantity.

The optical path of a laser beam downstream of the final lens in the optical system of this embodiment is exactly the same as in the optical systems of the first and second embodiments. Therefore, semiconductor films formed according to this embodiment exhibited basically the same properties as those formed according to the first and second embodiments.

Embodiment 4

This embodiment is directed to manufacturing a TFT (thin-film transistor) by using a crystallized, non-single-crystal silicon film formed according to any of the first to third embodiments. FIGS. 11A–11D show a manufacturing process according to this embodiment.

Figure 11A:
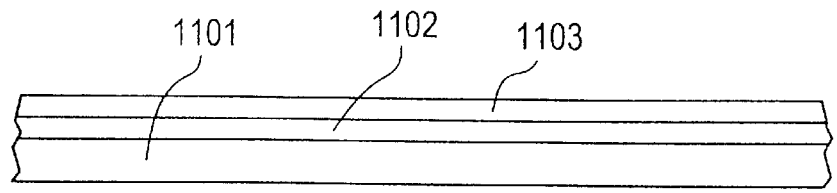
FIGS. 11A–11D show a manufacturing process according to a fourth embodiment of the invention.

As shown in FIG. 11A, a silicon oxide film 1102 as an undercoat film is formed on a substrate 1101 such as a glass substrate, and a non-single-crystal silicon film 1103 is formed thereon according to any of the first to third embodiments.

Figure 11B:
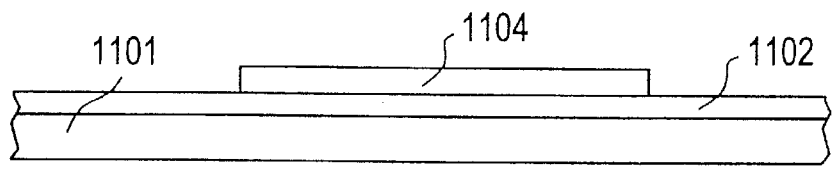
Figure 11C:
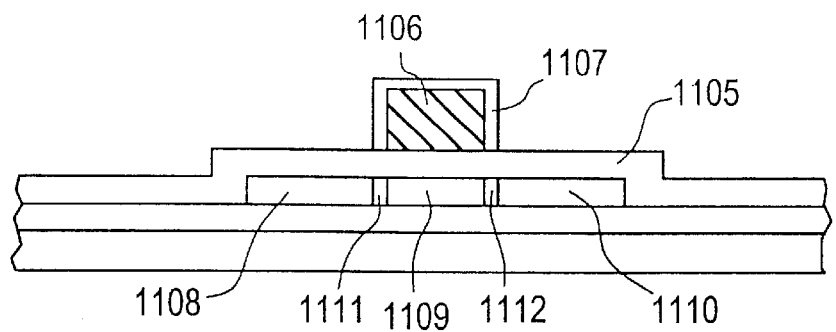

The non-single-crystal silicon film 1103 is then patterned into an island-like active layer pattern 1104 of a TFT (see FIG. 11B). A channel forming region and high-resistivity regions will be formed in the active layer pattern 1104.

Then, a 100-nm-thick silicon oxide film as a gate insulating film 1105 is formed by plasma CVD.

Thereafter, a 400-nm-thick titanium film is formed by sputtering and then patterned. Further, a 200-nm-thick anodic oxide film 1107 is formed on the exposed surfaces of the titanium film pattern by anodization, whereby a gate electrode 1106 is formed.

The anodic oxide film 1107 has a function of protecting the surfaces of the gate electrode 1106 electrically and physically, as well as a function of forming high-resistivity regions called offset regions adjacent to a channel forming region in a later step.

Then, phosphorus doping is performed by using the gate electrode 1106 and the anodic oxide film surrounding it as a mask. Phosphorus serves as a dopant that determines source and drain regions.

As a result of the phosphorus doping, a source region 1108, a channel forming region 1109, a drain region 1110, and offset regions 1111 and 1112 are formed in a self-aligned manner. In this embodiment, the phosphorus doping is performed at a dose of $5\times10^{14}$ ions/cm$^2$ by using an ion doping apparatus. Then, phosphorus is activated by applying laser light by the method according to the first embodiment. It was found that the activation was performed uniformly in the substrate surface.

The energy density of a laser beam is set at about 200 mJ/cm$^2$, for example. The proper energy density in this step depends on the type of a laser, the illumination method, and the states of a semiconductor film, and hence should be adjusted in accordance with those factors. It was found that as a result of the laser illumination the sheet resistance of the source and drain regions 1108 and 1110 decreased to 1 k$\Omega$/·(see FIG. 11C).

Thereafter, a 150-nm-thick silicon nitride film 1113 as an interlayer insulating film is formed by plasma CVD. Then, to planarize the surface, an acrylic resin film 1114 is formed on the silicon nitride film 1113 so as to have a minimum thickness 700 nm. Materials such as polyimide, polyamide, polyimideamide, and epoxy may be used instead of acrylic. The resin film may even be a multilayered film.

Figure 11D:
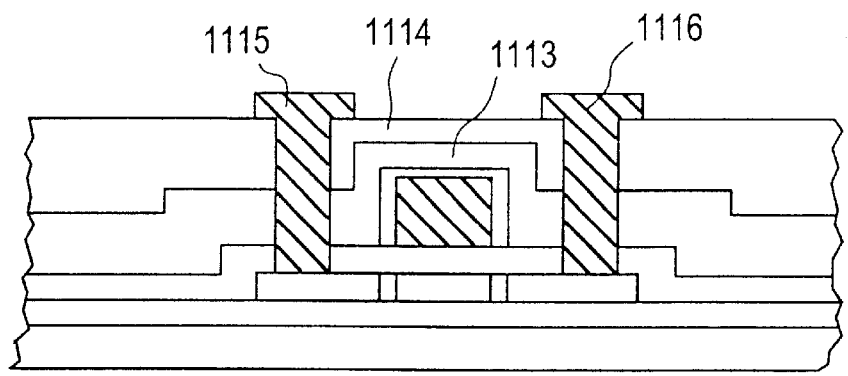

Then, after contact holes are formed, a source electrode 1115 and a drain electrode 1116 are formed (see FIG. 11D).

An n-channel TFT is thus completed. The n-channel TFT is formed because phosphorus is introduced into the source and drain regions. To form a p-channel TFT, boron may be introduced instead of phosphorus.

For example, when liquid crystal displays were manufactured by using TFTs that were produced by using semiconductor films formed according to the first to third embodiments, traces of the laser processing were less noticeable than in conventional cases.

As described above, the invention can greatly improve the uniformity of laser annealing in the surface of a semiconductor film by scanning the semiconductor film with a laser beam whose energy profile is uniformized by dividing an original laser beam and recombining divisional beams.

What is claimed is:

1. A method for forming a semiconductor device comprising:

generating a pulsed laser light;

shaping said pulsed laser light to a linear laser beam having a beam width W; irradiating said linear laser beam to a semiconductor film; and moving said semiconductor film during the irradiation at a pitch x which is a movement distance of said semiconductor film during an oscillation period of said pulsed laser light, wherein a condition $W/20 \leqq \Delta(r) \leqq x \leqq W/5$ is satisfied, where r is a height difference of a surface of said semiconductor film, $\Delta(r)$ is a variation amount of said beam width W as a function of said height difference r.

2. A method for forming a semiconductor device comprising:

generating a pulsed laser light;

shaping said pulsed laser light to a linear laser beam having a beam width W; irradiating said linear laser beam to a semiconductor film; and moving said semiconductor film during the irradiation at a pitch x which is a movement distance of said semiconductor film during an oscillation period of said pulsed laser light, wherein a condition $\Delta(r) \leqq W/20 \leqq x \leqq W/5$ is satisfied, where r is a height difference of a surface of said semiconductor film, $\Delta(r)$ is a variation amount of said beam width W as a function of said height difference r.

3. A method for forming a semiconductor device comprising:

generating a pulsed laser light;

shaping said pulsed laser light to a linear laser beam having a beam width W through an optical system; irradiating said linear laser beam to a semiconductor film; and moving said semiconductor film during the irradiation at a pitch x which is a movement distance of said semiconductor film during an oscillation period of said pulsed laser light, wherein a condition $W/20 \leqq rD/2F \leqq x \leqq W/5$ is satisfied, where r is a height difference of a surface of said semiconductor film, D is a dimension, in a direction perpendicular to a generatrix of a final lens of said optical system, of a beam incident region of said final lens, and F is a distance between said generatrix of said final lens and said semiconductor film.

4. A method for forming a semiconductor device comprising:

generating a pulsed laser light;

shaping said pulsed laser light to a linear laser beam having a beam width W through an optical system; irradiating said linear laser beam to a semiconductor film; and moving said semiconductor film during the irradiation at a pitch x which is a movement distance of said semiconductor film during an oscillation period of said pulsed laser light, wherein a condition $rD/2F \leqq W/20 \leqq x \leqq W/5$ is satisfied, where r is a height difference of a surface of said semiconductor film, D is a dimension, in a direction perpendicular to a generatrix of a final lens of said optical system, of a beam incident region of said final lens, and F is a distance between said generatrix of said final lens and said semiconductor film.

5. A method for forming a semiconductor device comprising:

forming a semiconductor film over a substrate;

generating a pulsed laser light; shaping said pulsed laser light to a linear laser beam having a beam width W; irradiating said linear laser beam to said semiconductor film to crystallize said semiconductor film; moving said semiconductor film during the irradiation at a pitch x which is a movement distance of said semiconductor film during an oscillation period of said pulsed laser light;

forming a gate insulating film over said semiconductor film after the irradiation; and forming a gate electrode over said gate insulating film, wherein a condition $W/20 \leqq \Delta(r) \leqq x \leqq W/5$ is satisfied, where r is a height difference of a surface of said semiconductor film, $\Delta(r)$ is a variation amount of said beam width W as a function of said height difference r.

6. A method for forming a semiconductor device comprising:

forming a semiconductor film over a substrate; generating a pulsed laser light; shaping said pulsed laser light to a linear laser beam having a beam width W; irradiating said linear laser beam to said semiconductor film to crystallize said semiconductor film; and moving said semiconductor film during the irradiation at a pitch x which is a movement distance of said semiconductor film during an oscillation period of said pulsed laser light; forming a gate insulating film over said semiconductor film after the irradiation; and forming a gate electrode over said gate insulating film, wherein a condition $(r) W/20 \times W/5$ is satisfied, where r is a height difference of a surface of said semiconductor film, (r) is a variation amount of said beam width W as a function of said height difference r.

7. A method for forming a semiconductor device comprising:

forming a semiconductor film over a substrate; generating a pulsed laser light; shaping said pulsed laser light to a linear laser beam having a beam width W through an optical system; irradiating said linear laser beam to said semiconductor film to crystallize said semiconductor film; and moving said semiconductor film during the irradiation at a pitch x which is a movement distance of said semiconductor film during an oscillation period of said pulsed laser light;

forming a gate insulating film over said semiconductor film after the irradiation; and forming a gate electrode over said gate insulating film, wherein a condition $W/20 \leqq rD/2F \leqq x \leqq W/5$ is satisfied, where r is a height difference of a surface of said semiconductor film, D is a dimension, in a direction perpendicular to a generatrix of a final lens of said optical system, of a beam incident region of said final lens, and F is a distance between said generatrix of said final lens and said semiconductor film.

8. A method for forming a semiconductor device comprising:

forming a semiconductor film over a substrate; generating a pulsed laser light; shaping said pulsed laser light to a linear laser beam having a beam width W through an optical system; irradiating said linear laser beam to said semiconductor film to crystallize said semiconductor film; and moving said semiconductor film during the irradiation at a pitch x which is a movement distance of said semiconductor film during an oscillation period of said pulsed laser light;

forming a gate insulating film over said semiconductor film after the irradiation; and forming a gate electrode over said gate insulating film, wherein a condition $rD/2F \leqq W/20 \leqq x \leqq W/5$ is satisfied, where r is a height difference of a surface of said semiconductor film, D is a dimension, in a direction perpendicular to a generatrix of a final lens of said optical system, of a beam incident region of said final lens, and F is a distance between said generatrix of said final lens and said semiconductor film.

9. A method according to claim 1 wherein said semiconductor film is crystallized by the irradiation of said linear laser beam.

10. A method according to claim 2 wherein said semiconductor film is crystallized by the irradiation of said linear laser beam.

11. A method according to claim 3 wherein said semiconductor film is crystallized by the irradiation of said linear laser beam.

12. A method according to claim 4 wherein said semiconductor film is crystallized by the irradiation of said linear laser beam.

13. A method according to claim 1 wherein $r \leq 1000\ \mu m$.
14. A method according to claim 2 wherein $r \leq 1000\ \mu m$.
15. A method according to claim 3 wherein $r \leq 1000\ \mu m$.
16. A method according to claim 4 wherein $r \leq 1000\ \mu m$.
17. A method according to claim 5 wherein $r \leq 1000\ \mu m$.
18. A method according to claim 6 wherein $r \leq 1000\ \mu m$.
19. A method according to claim 7 wherein $r \leq 1000\ \mu m$.
20. A method according to claim 8 wherein $r \leq 1000\ \mu m$.
21. A method according to claim 1 wherein $r \leq 100\ \mu m$.
22. A method according to claim 2 wherein $r \leq 100\ \mu m$.
23. A method according to claim 3 wherein $r \leq 100\ \mu m$.
24. A method according to claim 4 wherein $r \leq 100\ \mu m$.
25. A method according to claim 5 wherein $r \leq 100\ \mu m$.
26. A method according to claim 6 wherein $r \leq 100\ \mu m$.
27. A method according to claim 7 wherein $r \leq 100\ \mu m$.
28. A method according to claim 8 wherein $r \leq 100\ \mu m$.

29. A method according to claim 5 wherein said substrate has a size in a range of 100 mm×100 mm to 1000 mm×1000 mm.

30. A method according to claim 6 wherein said substrate has a size in a range of 100 mm×100 mm to 1000 mm×1000 mm.

31. A method according to claim 7 wherein said substrate has a size in a range of 100 mm×100 mm to 1000 mm×1000 mm.

32. A method according to claim 8 wherein said substrate has a size in a range of 100 mm×100 mm to 1000 mm×1000 mm.

33. A method according to claim 5 wherein said substrate has a size in a range of 300 mm×300 mm to 800 mm×800 mm.

34. A method according to claim 6 wherein said substrate has a size in a range of 300 mm×300 mm to 800 mm×800 mm.

35. A method according to claim 7 wherein said substrate has a size in a range of 300 mm×300 mm to 800 mm×800 mm.

36. A method according to claim 8 wherein said substrate has a size in a range of 300 mm×300 mm to 800 mm×800 mm.

* * * * *